United States Patent
Tilmans et al.

(10) Patent No.: US 7,368,311 B2
(45) Date of Patent: May 6, 2008

(54) METHOD AND SYSTEM FOR FABRICATION OF INTEGRATED TUNABLE/SWITCHABLE PASSIVE MICROWAVE AND MILLIMETER WAVE MODULES

(75) Inventors: Hendrikus Tilmans, Maastricht (NL); Eric Beyne, Leuven (BE); Henri Jansen, Leuven (BE); Walter De Raedt, Edegem (BE)

(73) Assignee: Interuniversitair Microelektronica Centrum (IMEC) (BE)

( * ) Notice: Subject to any disclaimer, the term of this patent is extended or adjusted under 35 U.S.C. 154(b) by 0 days.

(21) Appl. No.: 10/897,271

(22) Filed: Jul. 21, 2004

(65) Prior Publication Data

US 2005/0003606 A1  Jan. 6, 2005

Related U.S. Application Data

(63) Continuation of application No. 10/127,341, filed on Apr. 18, 2002, now Pat. No. 6,876,056.

(60) Provisional application No. 60/285,557, filed on Apr. 19, 2001.

(51) Int. Cl.
*H01L 21/00* (2006.01)

(52) U.S. Cl. .................. 438/48; 257/E29.167

(58) Field of Classification Search ........ 438/622–623, 438/725, 10, 6, 379, 48, 50, 51, 52, 54, 55, 438/57; 257/E27.004, E27.009, E27.113, 257/E27.114, E29.001, E29.111, E29.166, 257/E29.167, E29.324
See application file for complete search history.

(56) References Cited

U.S. PATENT DOCUMENTS

| | | | |
|---|---|---|---|
| 3,829,881 A | 8/1974 | Kohashi | |
| 5,070,317 A | 12/1991 | Bhagat | |
| 5,638,946 A * | 6/1997 | Zavracky | 200/181 |
| 5,808,527 A | 9/1998 | De Los Santos | |
| 5,883,382 A | 3/1999 | Asada | |
| 6,195,047 B1 | 2/2001 | Richards | |
| 6,331,257 B1 * | 12/2001 | Loo et al. | 216/13 |
| 6,384,353 B1 * | 5/2002 | Huang et al. | 200/181 |
| 6,396,368 B1 * | 5/2002 | Chow et al. | 333/262 |
| 6,410,360 B1 * | 6/2002 | Steenberge | 438/52 |

(Continued)

FOREIGN PATENT DOCUMENTS

EP  0 849 820 A2  6/1998

OTHER PUBLICATIONS

"Micromachined Tranducers Sourcebook", ed. by Kevin Kane, WCB/McGraw-Hill, New York, pp. 320-332, (1998).

(Continued)

*Primary Examiner*—Scott B. Geyer
(74) *Attorney, Agent, or Firm*—Knobbe, Martens, Olson & Bear LLP

(57) ABSTRACT

An interconnect module and a method of manufacturing the same. The method of making an interconnect module on a substrate comprises forming an interconnect section on the substrate. The interconnect section comprises at least two metal interconnect layers separated by a dielectric layer. The method further comprises forming a passive device on the substrate at a location laterally adjacent to the interconnect section. The passive device comprises at least one moveable element comprising a metal layer. The method further comprises forming the metal layer and one of the at least two metal interconnect layers from substantially the same material.

5 Claims, 15 Drawing Sheets

U.S. PATENT DOCUMENTS

| | | | |
|---|---|---|---|
| 6,610,440 B1 * | 8/2003 | LaFollette et al. | 429/122 |
| 6,741,207 B1 * | 5/2004 | Allison et al. | 342/371 |
| 6,741,449 B1 * | 5/2004 | Pasternak | 361/303 |
| 2002/0074621 A1 | 6/2002 | Cheng et al. | |
| 2003/0199118 A1 | 10/2003 | Park et al. | |

OTHER PUBLICATIONS

"Multichip Module Technologies and Alternatives", ed. by Daryl Ann Doane and Paul D. Franzon, Van Nostrand Reignhold, New York, pp. 5-11 and 43-56, (1993).

"The MEMS Handbook", ed. by Mohamed Gad-el-Hak, CRC Press, New York, pp. 16:117-16:132 & 26:5-26:6 (2001).

Ahn, et al., "A fully integrated planar toroidal inductor with a micromachined nickel-iron magnetic bar", IEEE Transactions on Components, Packaging, and Manufacturing Technology-Part A, vol. 17, No. 3, pp. 463-469, (Sep. 1994).

Butler, et al., "Investigation of MEMS packaging using multichip module foundries", Sensors and Materials, vol. 11, No. 2, pp. 87-104 (1999).

Ferendeci, Altan, M., "Monolithically processed vertically interconnected 3D phased array antenna module", IEEE, pp. 151-157 (2000).

Ferendeci, et al., "3D multilayer monolithic microwave ($M^3$) passive transmitter module", IEEE MTT-S Digest, pp. 445-448 (1999).

Jourdain, et al., "Influence of 0-level packaging on the microwave performance of RF-MEMS devices", 31st European Microwave Conference-London, pp. 403-406 (2001).

Liakopoulos, et al., "3-D microfabricated toroidal planar inductors with different magnetic core schemes for MEMS and power electronic applications", IEEE Transactions on Magnetics, vol. 35, No. 5, pp. 3679-3681 (Sep. 1999).

Tilmans, et al., "Wafer-level packaged RM-MEMS switches fabricated in a CMOS fab", IEEE, pp. 921-924, (2001).

Wang, et al., "Interlayers MEMS RF switches for 3-D MMICS", IEEE, pp. 1245-1248 (2000).

Xu, et al., "A microfabricated transformer for high-frequency power or signal conversion", IEEE Transactions on Magnetics, vol. 34, No. 4, pp. 1369-1371 (Jul. 1998).

European Search Report dated Dec. 23, 2003, for European Patent Application No. EP 02 07 6528.

E.A. Sovero et al. "Monolithic GaAs PHEMT MMIC's Integrated with High Performance MEMS Microrelays"(IEEE MTT-S IMOC 1999 Proceedings, Brazil, p. 257).

* cited by examiner

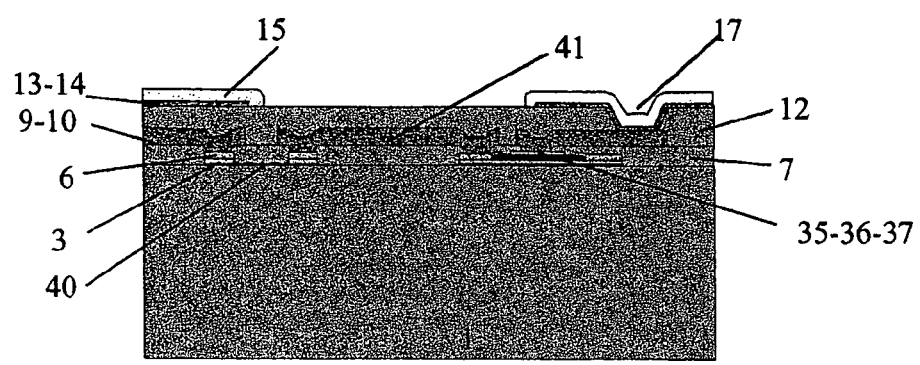
Fig. 1 : prior art
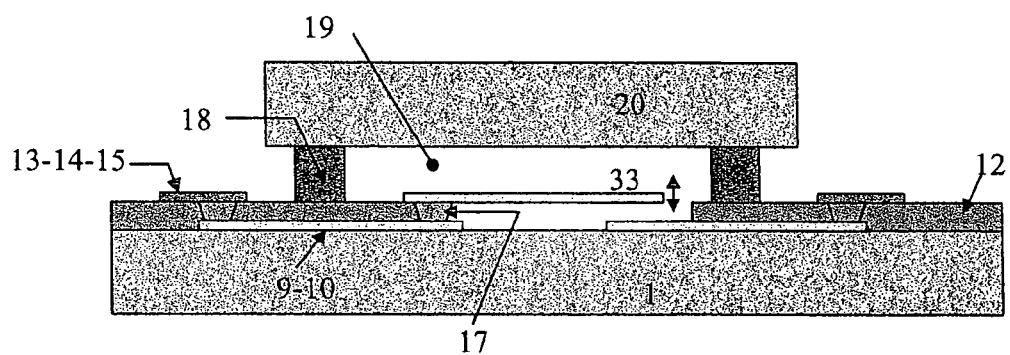
Fig. 2

1

2

3

4

5

6

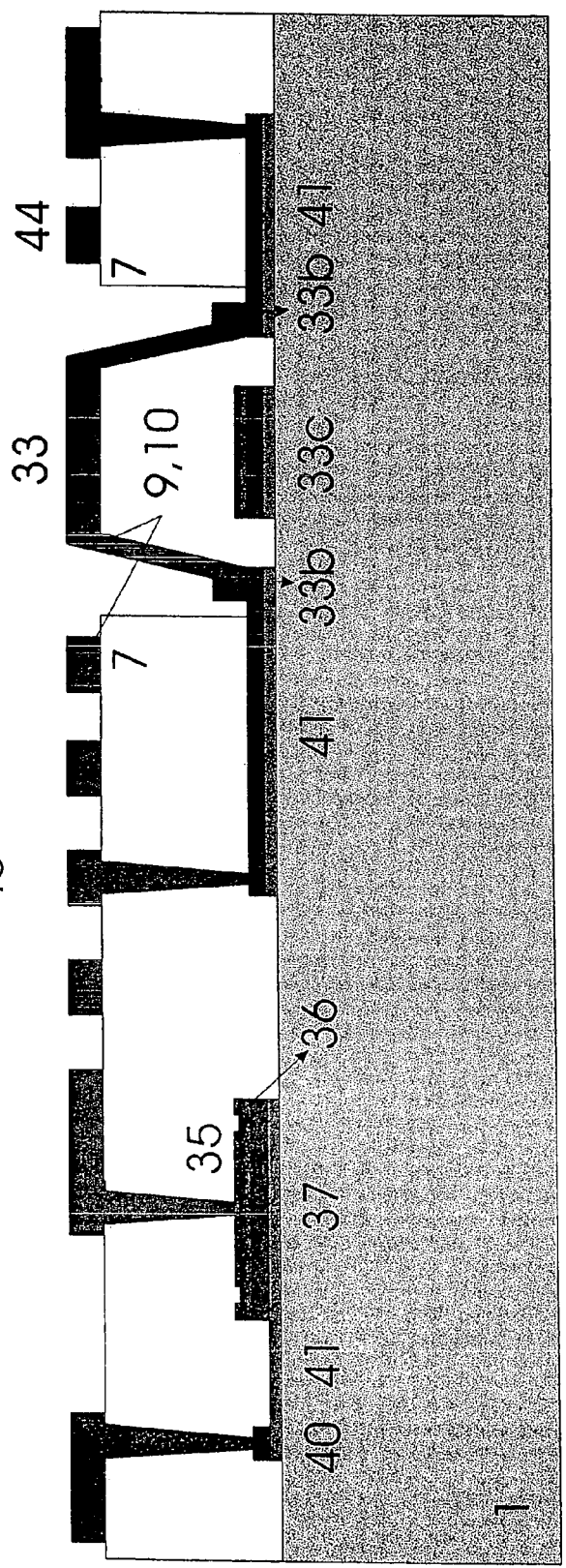
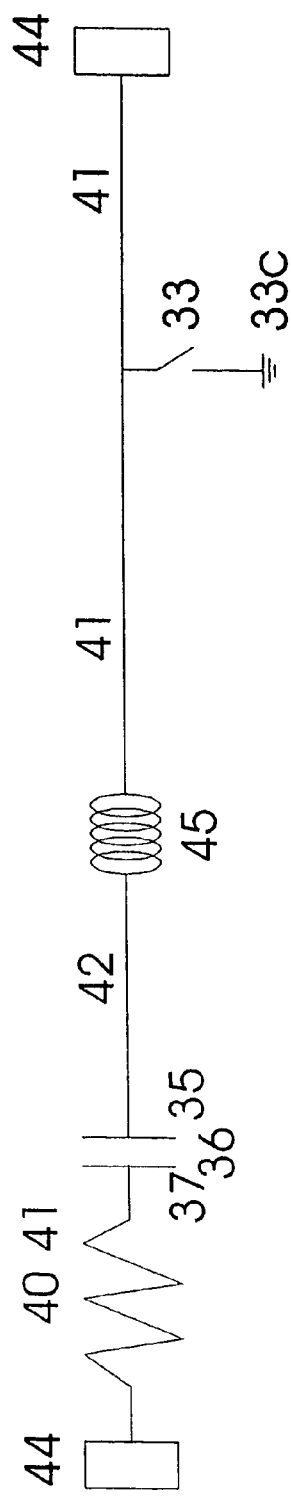
Figure 7

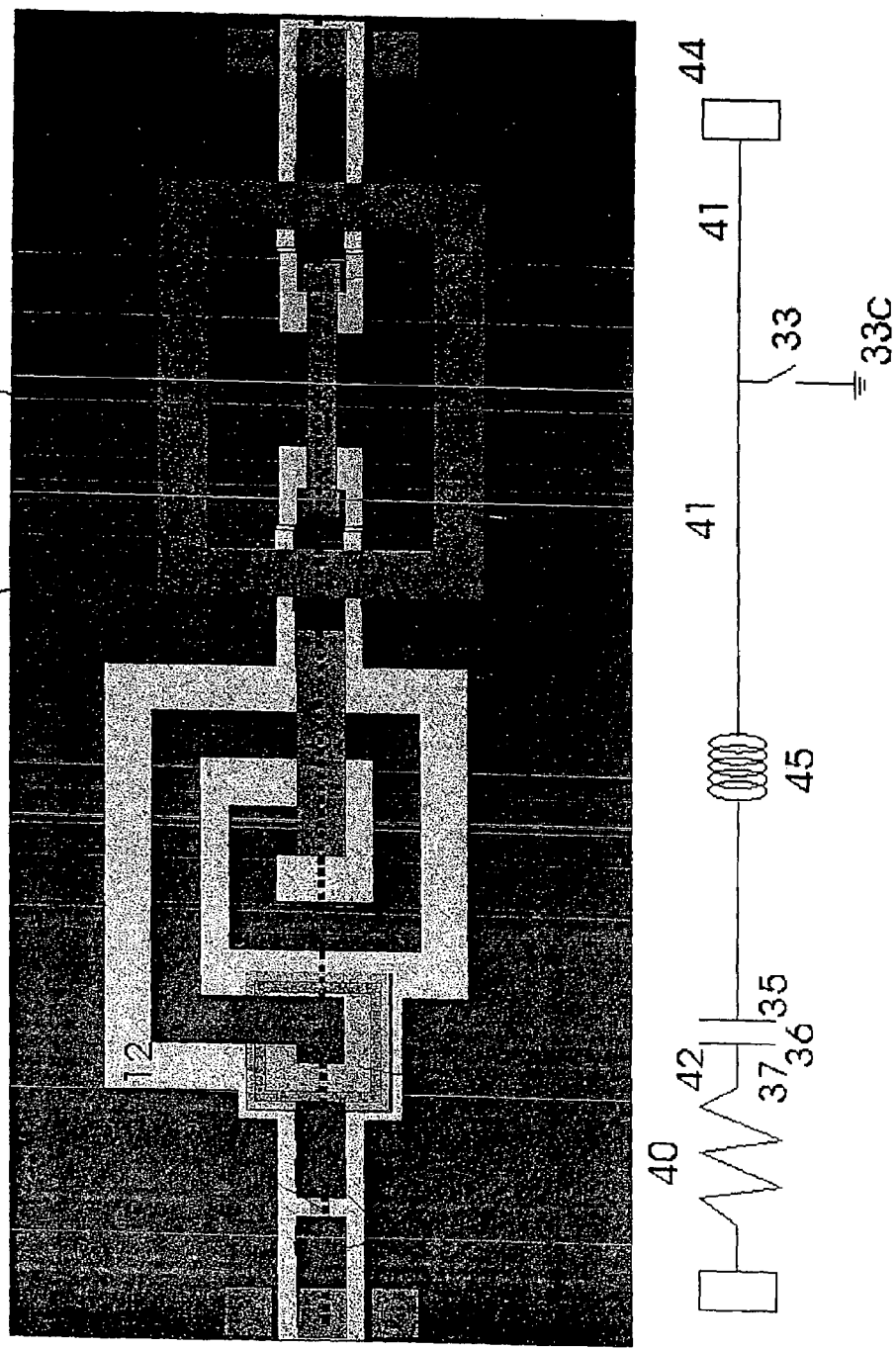

METHOD AND SYSTEM FOR FABRICATION OF INTEGRATED TUNABLE/SWITCHABLE PASSIVE MICROWAVE AND MILLIMETER WAVE MODULES

RELATED APPLICATIONS

This application is a continuation, and incorporates by reference the entire disclosure, of U.S. application Ser. No. 10/127,341, filed Apr. 18, 2002 now U.S. Pat. No 6,876,056, entitled "METHOD AND SYSTEM FOR FABRICATION OF INTEGRATED TUNABLE/SWITCHABLE PASSIVE MICROWAVE AND MILLIMETER WAVE MODULES", which claims priority to U.S. provisional application entitled "TECHNOLOGY PLATFORM FOR THE FABRICATION OF FIXED AND VARIABLE INTEGRATED PASSIVE DEVICES (IPDs) TO YIELD INTEGRATED TUNABLE/SWITCHABLE PASSIVE MICROWAVE AND MILLIMETER WAVE MODULES", having Application No. 60/285,557, and a filing date of Apr. 19, 2001.

FIELD OF THE INVENTION

The present invention relates to the fabrication of integrated tunable and/or switchable passive microwave and millimeter wave modules with interconnects to other devices.

BACKGROUND OF THE INVENTION

There has been an explosive growth in wireless communication and the emergence of commercial and consumer applications of radio frequency (RF), microwave, and millimeter-wave circuits and systems in a number of areas. These areas include wireless personal communication and local area networks (WLAN), satellite communications, and automotive electronics. Future personal and ground communications systems as well as communications satellites impose requirements such as very low weight and low power consumption, and small volume. The decrease in size and weight, the ever increasing frequency as well as the trend toward greater functionality of the communications systems, platforms are necessitating the use of highly integrated RF front-end circuits. Continuing chip scaling has contributed a lot to this goal, at least to the boost in the functionality of the devices or to the increase in operational frequency of e.g. CMOS-based technologies. However today a situation has been reached where the presence of the expensive, off-chip passive RF components, whether tunable or not, such as high-Q capacitors, high-Q inductors, resistors, switches, varactor diodes, high-Q resonators, and filters plays a limiting role.

Printed circuit boards have been used extensively as a technology platform to which these individual electronic components are mounted. To provide greater densities and more flexibility, sets of chips can be mounted on a separate packaging substrate. Various designs of these substrates have been proposed, the major ones of which are described in the book "Multichip Module Technologies and Alternatives", D. A. Doane and P. D. Franzon, Van Nostrand Reinhold, 1993. An example of such substrate is the Multichip module substrate (MCM substrate) that typically provides an interconnect facility or sometimes also integrated simple passive devices such as resistors.

To provide tunable components with movable parts, e.g. switches, traditional semiconductor processing has been modified to produce micrometer devices and has come to be known as Micro electromechanical Systems (MEMS). Generally, MEMS processing is non-conventional and separate rather than integrated devices have generally been produced.

To provide a complete RF device/system various separate components have to be brought together. A first approach is called the hybrid approach. This hybrid approach combines components, manufactured in various technologies, each having its own purpose, specifications and targets, on a single technology platform, adapted for receiving and interconnecting this variety of components. Any RF-MEMS variable Integrated Passive Devices (IPDs) or any active circuitry, e.g. BiCMOS, GaAs or CMOS, are flip-chip assembled onto the platform, e.g. a microwave MCM-D carrier substrate containing the interconnects and the fixed IPDs, such as resistors, operating in the RF and microwave regime.

Today there are three mainstream technologies that can be used as a technology platform in such hybrid approach:

Ceramics-based (thick-film) technology, e.g., Low Temperature Co-firedCeramic (LTCC).

Thin-film based technology, e.g., Multi Chip Module (MCM) using Deposited thin films (MCM-D).

Technologies based on the extension and scaling down of printed circuit board (PCB) or printed wiring board (PWB) technologies, e.g., MCM-L (where the L stands for laminate) constructed of plastic laminate-based dielectric and copper conductors.

The latter based technologies, i.e. PCB or PWB based technologies, are most commonly used in low frequency digital applications, and are not very suited for RF and microwave applications. The other two technology platforms, such as LTCC and MCM-D, can be suited for RF and microwave applications. Of these, LTCC allows the integration of capacitors, resistors and inductors in a single ceramic or glass-ceramic body. This is achieved by combining low-firing ferrite, dielectric and conductive materials in a multilayer ceramic process with sintering temperatures around 850° C. MCM-D is a recently developed technology that is based on thin-film techniques as used in the semiconductor IC industry but applied using different materials. Hereby, thin film MCM devices are fabricated by a sequential deposition of thin conductor and dielectric layers on a substrate by, e.g., evaporation, sputtering, electroplating, chemical vapor deposition (CVD) and spin coating. The layers are structured with standard photolithographic and etching or selective deposition. The second approach is called the monolithic approach. In this monolithic approach these Integrated Passive Devices or passive components can be integrated in or on a semiconductor chip. However, despite many years of research, such on-chip passive components based on electronic solutions, implemented and/or integrated in various RF-IC (Radio Frequency integrated circuit) technologies including BiCMOS, SiGe and GaAs, did not result in components with the high-quality offered by discrete passive components and which are required by most wireless applications.

A comparison of the different microwave IPDs technologies, also including the RFIC technologies, as outlined above, is presented in Table 1.

TABLE 1

Comparison of the different technologies for microwave IPDs.

| Tech. | Cost | Performance Q-factor | Max. freq. (GHz) | Process-control | Tunable/ Switches | Metal levels | W ± ΔW (μm) | On-chip RF ICs |
|---|---|---|---|---|---|---|---|---|
| MCM-D | Cheap substrate (glass) 1-1.5 USD/cm$^2$ | $Q_L$ = 30-150 | 50 | Average | No | >2 | 10 ± 1 | no |
| RF-MEMS | Cheap substrate (glass) 0.5-1 USD/cm$^2$ | $Q_L$ = 40 $Q_C$ = 50 (varicap) | 80 | average | Yes | <2 | 10 ± 1 | no |
| LTCC | Glass-ceramic 1-1.5 USD/cm$^2$ | $Q_L$ > 40 | 10 | poor | No | >3 | 100 ± 2 | no |
| III-V (GaAs) | Very expensive substrate, 30 USD/cm$^2$ | $Q_L$ < 10 | 15 (FET) 110 (HEMT) | good | yes | >4 | 1 ± 0.1 | yes |
| BiCMOS | Expensive subst. (HRS, SiGe), 10 USD/cm$^2$ | $Q_L$ < 8 | 50 (BiPSiGe) | good | yes | >1 | 1 ± 0.1 | yes |
| III-V + MEMS | Very expensive substrate | $Q_L$ < 10 | <50 | average | yes | >4 | 10 ± 1 | Yes |

Based on this table, it is concluded that LTCC although applicable for microwave Integrated Passive Devices ('IPDs') has certain drawbacks when it comes to size, density as indicated by the line width W, and maximum operating frequency. Further, the on-chip passive components based on RF-IC technologies (BiCMOS, SiGe or GaAs) do not offer the high-quality as required by most wireless applications e.g. the Q-factor of the inductors is typically below 10, whereas Q-factors exceeding 30 are desired. Compare this to MCM-D Q factors, which are around 50 for fixed devices, e.g. both the capacitors and the inductors. One reason for the worse RF-behavior is the lossy substrates used in standard processes. Quality substrates such as High Resistive Silicon (HR-Si), GaAs and SOI substrates, needed for the manufacturing of active devices, are only available at a higher cost. Even in case of high quality substrates the RF-performance can be low. Due to the limited dimensions of the conductor wiring interconnecting the active and fixed passive devices on the substrate dielectric losses can be high. Not only the RF-performance but also the technology cost is an important issue. The cost for MCM-D is around 1-1.5 USD/cm$^2$ (for a 7-mask process). This should be compared to the cost of 10 USD/cm$^2$ for a standard BiCMOS process and an even higher cost of 30 USD/cm$^2$ for a GaAs process. It should be said though, that the latter two processes not only offer integrated passives but full integration with active circuitry as well. Development of passive devices in such technology is however expensive as such changes might affect the overall technology, including the active devices. The development of a monolithic process is a complex and time-consuming process. Due to the shortcomings of RFIC technologies, ever increasing pressure is placed on the need to develop technologies for the fabrication of "integrated passive devices (IPDs)" operating in the RF and microwave regime. The thin-film integrated technologies generally provide the level of precision, range of component values, performance and functional density at a reasonable cost, which makes these technologies suited for the fabrication of microwave IPDs, thus allowing a more integrated, smaller, and lighter implementation of a given RF function compared to the monolithic approach IPDs for today's wireless communication systems not only encompass fixed parameter value components, but also variable parameter value components such as RF switches or varicaps. As Table 1 indicates, variable or tunable IPDs can be fabricated in several technologies. As elucidated earlier however, the RFIC technologies are not suited for fabricating high quality IPDs, which limits the field of application of these technologies. The potential of RF-MEMS for miniaturization and integration, makes MEMS technology into a leading technology for the realization of variable IPDs, e.g., filters, switches, capacitors, inductors, with the potential of fabricating tunable/switchable modules, e.g. adaptive matching networks. The introduction of tunability and switchability in RF communication front-ends opens a way to design innovative, re-configurable RF transceiver architectures, like multi-band transceivers, which will be needed in present and next-generation wireless communication systems. It is expected that RF-MEMS technology will solve some of the most troublesome problems related to the use of discrete passive tunable/switchable components. The technology can yield small, low weight and high performance tunable/switchable RF components to replace some of the bulky, expensive and unwanted discrete passive RF components. Basically these RF-MEMS components contain movable parts and/or suspended parts, e.g., suspended inductors or transmission lines. All these features as offered by RF-MEMS make this technology a very attractive choice for the fabrication of variable IPDs. In addition variable RF-MEMS passive components in some cases display superior performance characteristics as opposed to their semiconductor counterparts.

TABLE 2

Comparison of typical performance characteristics of RF switch types

|  | GaAs MMIC (MESFET type) | PIN diode | RF-MEMS switch |
|---|---|---|---|
| Insertion loss (@2 GHz) | 0.51 dB | 0.6 dB | <0.2 dB |
| Isolation (@2 GHz) | −25 dB | −50 dB | −35 dB |
| Return loss (@2 GHz) | −20 dB | −10 dB | −35 dB |
| Max. RF frequency | 10 GHz | 10 GHz | 80 GHz |
| Switching time | tens of ns | hundreds ns | Hundreds of ns |
| RF power handling | 30 dBm | 30 dBm | 30 dBm (1 W) |
| Actuation/bias voltage | +5 V[1] | +5, −5 V | >12 V |
| Standby power consumption | tens of micro W | few mW | "zero" |
| IP3 | 37 dBm | 44 dBm | >66 dBm[2] |
| Die size (SPDT[3] switch) | 1.1 × 1.1 × 0.7 mm$^3$ | 0.8 × 1.3 × 0.7 mm$^3$ | 2 × 1 × 0.7 mm$^3$ |
| Body size | <3.5 × 3.5 × 2 mm$^3$ | <3.5 × 3.5 × 2 mm$^3$ | <4 × 2 × 2 mm$^3$ |

[1]TTL compatible bias voltage.
[2]Beyond the limits of measurement equipment (IP3 extrapolated as better than 66 dBm).
[3]Single Pole Double Throw, e.g., implemented as a toggle for antenna switching or T/R switching.

An example is presented in Table 2 in which the performance characteristics of different types of miniature RF switches are compared. The table clearly shows the outstanding performance of RF-MEMS switches in terms of insertion loss, power consumption and linearity. For instance, the insertion loss of RF-MEMS switches is typically around 0.2 dB in the range 1-10 GHz, whereas FET type switches exhibit an insertion loss around 1 dB in the same frequency regime.

Table 3 presents an indicative performance overview of the different technology platforms implementing RF-MEMS. MEMS processing and materials are closely linked to semiconductor processing and materials hence, in the monolithic approach the MEMS part is processed with the semiconductor substrate, e.g. on top of the semiconductor device. An example of such integration is given in <<Monolithic GaAs PHEMT MMIC's integrated with high performance MEMS Microrelays <<by E. A. Sovero et al. (IEEE MTT-S IMOC 1999 Proceedings, Brazil, p 257). Such processing has the disadvantage that a MEMS device consumes relatively large and thus expensive chip area. Further the process freedom of such monolithic integrated IPD is limited. As was already the case for the fixed passives already implemented in such fully integrated process, e.g. CMOS, the characteristics of the underlying active devices may not be changed by the subsequent processing of the passive devices. Such process restriction will limit the type and number of IPD feasible in this monolithic approach.

Although the RF-MEMS technology has clear advantages as explained above, the technology also displays drawbacks. For instance, the interconnection levels are very limited and so are the number and quality of fixed passives.

Hence, it can be said, that none of the aforementioned technology platforms offers a flexible, cost-effective solution for the fabrication of a wide range of fixed or tunable high quality RF and microwave IPDs. It is an object of the present invention to provide such a platform and a method of making it.

SUMMARY OF THE INVENTION

In one embodiment, the invention provides a method of making an interconnect module on a substrate comprises forming an interconnect section on the substrate. The interconnect section comprises at least two metal interconnect layers separated by a dielectric layer. The method further comprises forming a passive device on the substrate at a location laterally adjacent to the interconnect section. The passive device comprises at least one moveable element comprising a metal layer. The method further comprises forming the metal layer and one of the at least two metal interconnect layers from substantially the same material.

The present invention will now be described with reference to the following drawings.

TABLE 3

Comparison of the different technology approaches implementing RF-MEMS.

| Technologies for RF-MEMS and fixed passives | Max. RF Freq. | Range of available passives | Interconnect flexibility | Degree of miniaturization (size, weight) | Cost of Tunable RF module | Time to market | Technology life |
|---|---|---|---|---|---|---|---|
| Hybrid (LTCC, MCM-D) | low | wide | High | low | medium | Short | Long |
| Monolithic (GaAs MMIC + RF-MEMS) | high | limited | Medium | high | high | Long | Short |

BRIEF DESCRIPTION OF THE DRAWINGS

FIG. 1 shows a cross section of a conventional MCM-D substrate illustrating the interconnect levels and the fixed passives devices.

FIG. 2 is a cross section through a device according to an aspect the present invention showing variable passive devices formed in the MCM-D technology and sealed by means of zero-level packaging.

FIGS. 7 to 11 is a schematic representation of various embodiments of the invention.

Figure 3A:
FIGS. 3A-3T (collectively hereinafter referred to as "FIG. 3") show intermediate device cross sections illustrating a process sequence including steps 1-17 according to an aspect of the present invention.
Figure 3B:
Figure 3C:
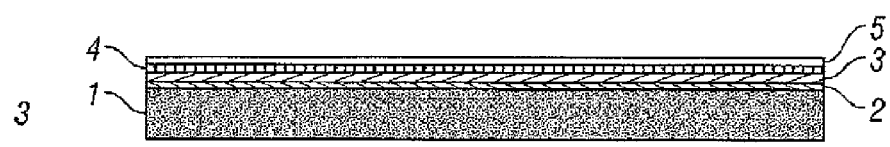
Figure 3D:
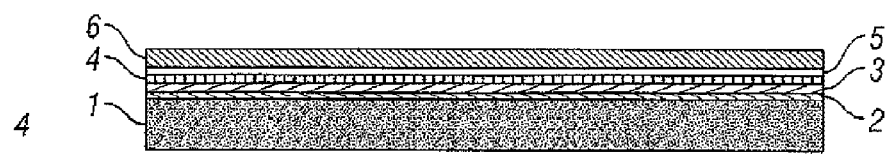
Figure 3E:
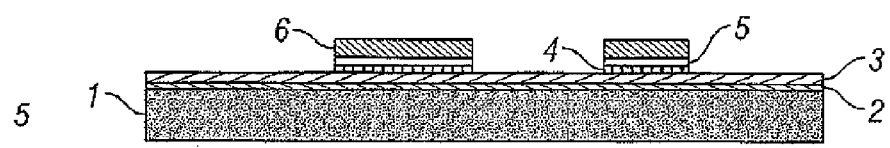
Figure 3F:
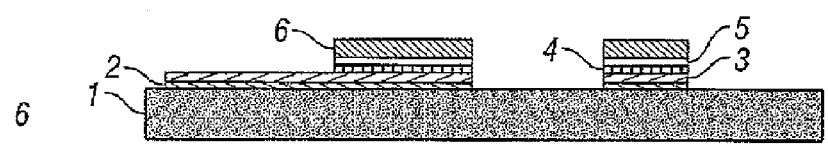
Figure 3G:
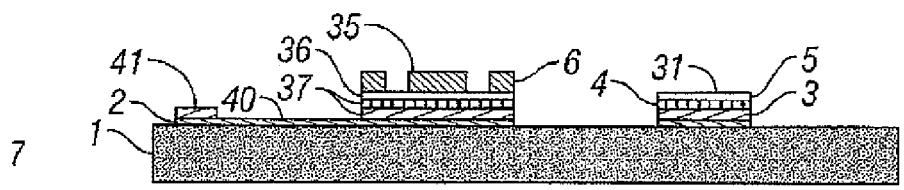
Figure 3H:
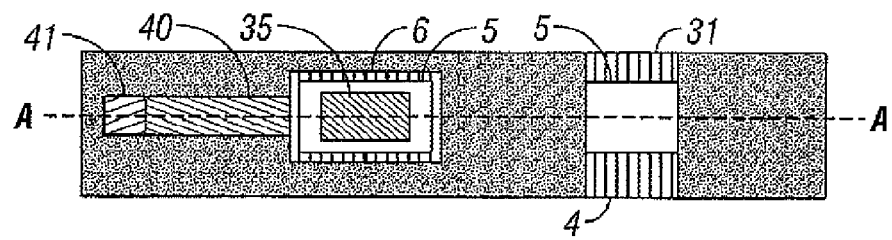
Figure 3I:
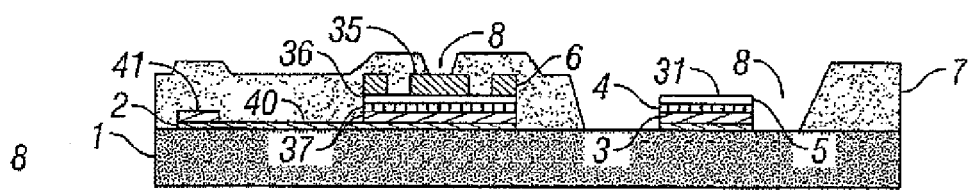
Figure 3J:
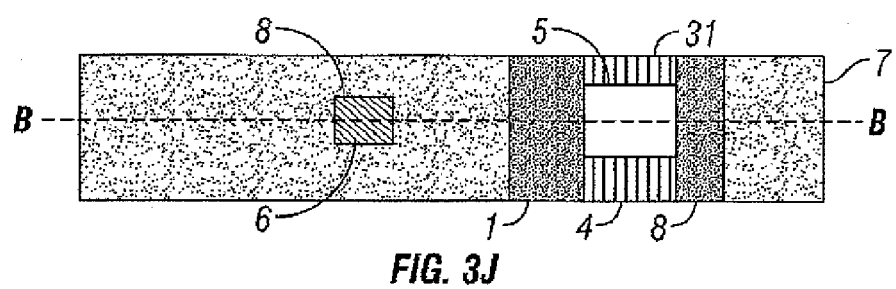
Figure 3K:
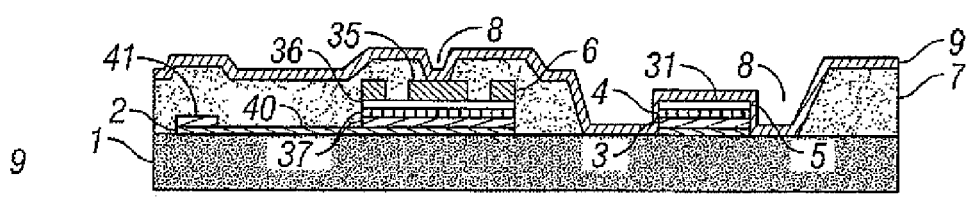
Figure 3L:
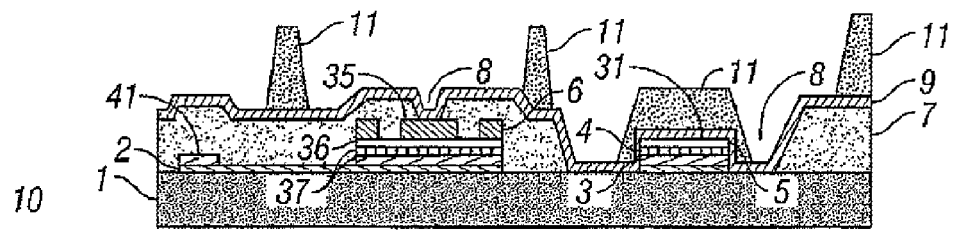
Figure 3M:
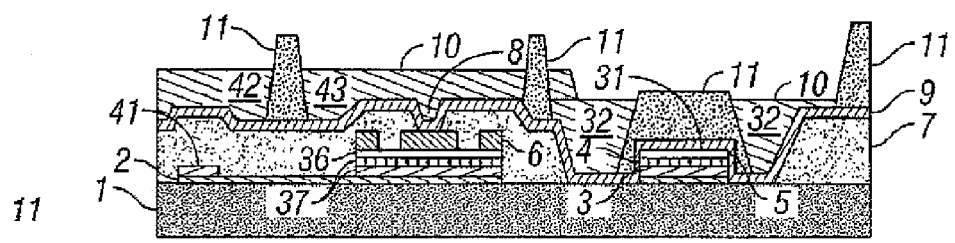
Figure 3N:
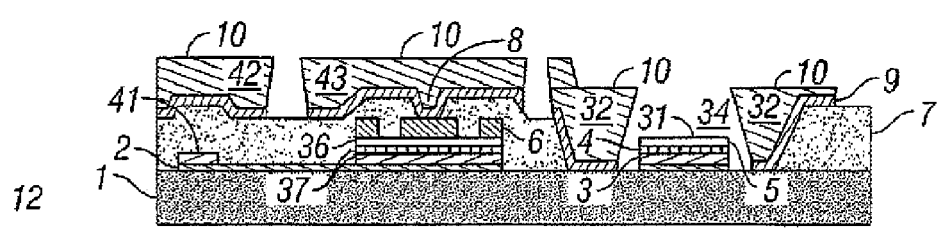
Figure 3O:
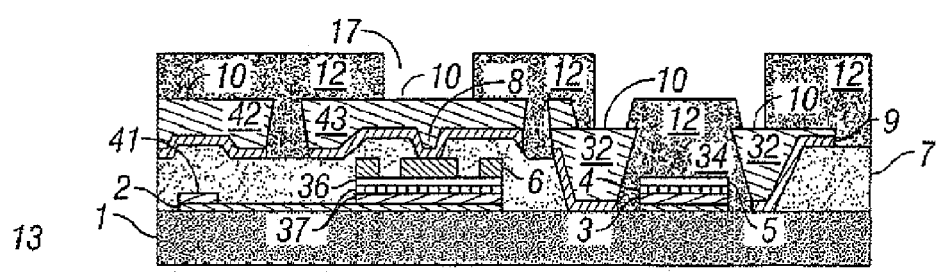
Figure 3P:
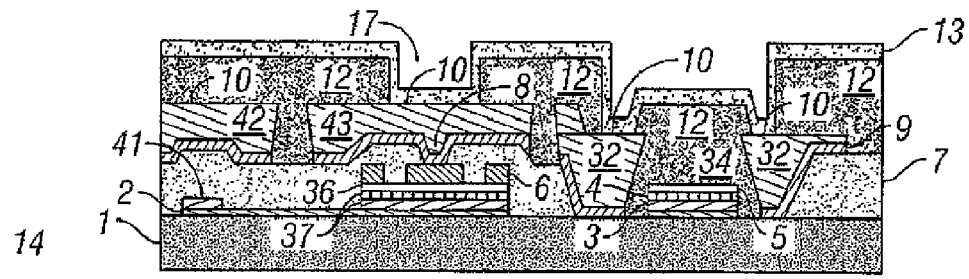
Figure 3Q:
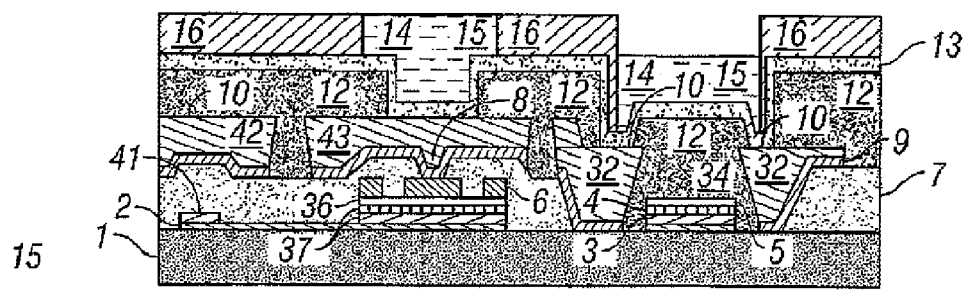
Figure 3R:
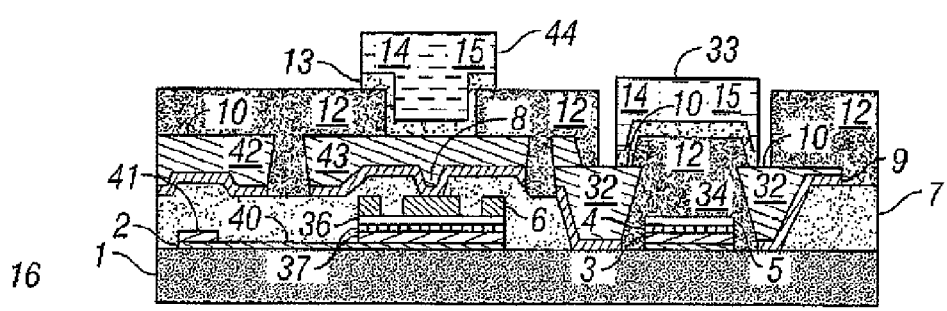
Figure 3S:
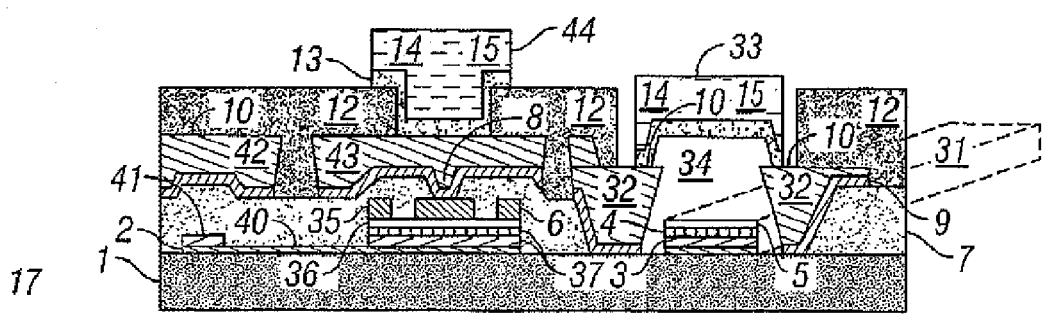
Figure 3T:
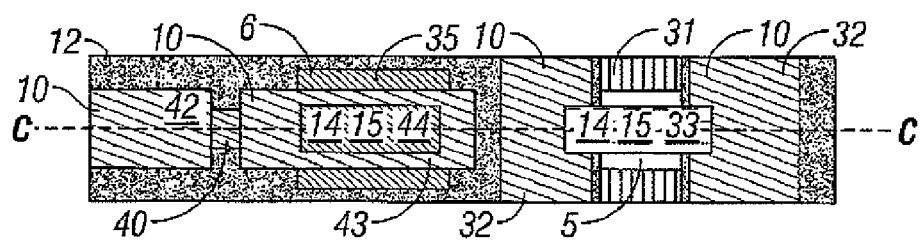

Table 1. Comparison of different prior art technologies for microwave IPDs.

Table 2. Comparison of typical performance characteristics of RF switch types processed using prior art technologies.

Table 3. Comparison of different prior art technology approaches implementing RF-MEMS.

DESCRIPTION OF THE INVENTION

The present invention will be described with reference to certain preferred embodiments and drawings but the present invention is not limited thereto but only by the claims. In particular in the following the material BCB will be described for use as the interlevel dielectric material. Other materials may be used as known for instance from the book by Doane and Franzon mentioned above.

The concept of integration of passive components is to combine various passive elements onto one substrate, thereby creating added value in terms of cost, miniaturization, reliability, functionality and performance. The present invention provides a platform capable of simultaneous forming and/or integrating a large number of fixed and variable passive devices, whereby a variable device has at least one moveable component or element. Preferably this platform also provides the integration of active devices in a flexible, easy and adaptable way. The combination of active devices and of passive devices is done in a cost-effective way. Such a device may be formed on an economical substrate such as glass, can have a performance Q factor above 30 for both inductors ($Q_L$), e.g. between 30-150, and for capacitors ($Q_C$), e.g. of about 50, has an operating frequency up to 80 GHz and has at least two metal layers.

In a preferred embodiment the present invention high integration levels are achieved for IPDs through the incorporation of RF-MEMS components in a microwave MCM-D substrate. The MCM-D technology as used with the present invention allows at least the fabrication of following structures/components:

Lumped element structures:
these are structures that are physically much smaller compared to the wavelength of the signals. These structures include:
Flip chip and wire bond connection pads;
Line bends and connection;
Fixed passive components: resistors, capacitors and inductors; and
Spiral baluns.
Distributed elements structures:
these are structures that are a significant fraction of, or larger than the wavelength of the signals:
Transmission lines;
Coupling structures, e.g., Lange couplers, ring couplers, and other similar couplers;
Line baluns; and
Power dividers/splitters.

The MCM-D technology as used with the present invention can define a microwave design platform taking care of the high frequency interconnects and moreover, offers a readily available library of IPDs such as fixed RF capacitors, inductors and resistors, transmission lines, quarter-wave stubs, etc. A basic component library can be made available which eases design and development of new RF-modules. MCM-D is suitable for at least up to 50 GHz operation. The microwave build-up structure of an existing MCM-D technology is shown in FIG. 1. As can be seen, this build-up consists of integrated resistors (40) and capacitors (35-36-37) on the substrate (1), a thin film (low K) dielectric layer (7) followed by a thick copper interconnection layer (9-10). This layer contains the main interconnect lines (41) in the form of so-called coplanar wave guide (CPW) structures. This layer is also used to realize the high-Q spiral inductors (42). This layer is followed by a next dielectric layer (12), which acts also as a passivation layer for the structure. The top metal layer (13-14-15) is used for component attach and may also be used to realize thin film capacitors with the underlying metal layers.

MCM-D as used with the present invention allows the fabrication of an integrated system maintaining maximum RF performance, including high density packaging and testing algorithms. This allows integration of entire RF front-end circuits of wireless communication systems onto a single package.

One aspect of the present invention is to provide an MCM-D/MEMS interconnect platform, which allows the integrated fabrication of the fixed and variable IPD's to yield stand-alone interconnect modules or single-chip or multi-chip tunable/switchable modules offering improved functionality. As opposed to the hybrid approach in which flip-chip interconnection of variable or moveable passive devices is used to introduce RF-MEMS IPDs, in an aspect of the present invention the fixed and variable RF-MEMS IPDs are integrated with fixed MCM-D IPDs into the same process flow. In other words, a fully integrated solution for a large range of fixed and variable microwave and RF passives is obtained in an MCM substrate. One example of such a device is shown schematically in FIG. 2. In this way flip-chip of RF IPD assembly operations are avoided or severely reduced and therefore cost is reduced. Moreover, the wafer-level or 0-level package of the RF-MEMS device(s) is made simpler as shown in FIG. 2 as the sealed device can be connected using the interconnectivity of the MCM-D substrate while the MDM-D dielectric layers insulate the solder ring of the 0-level packaging from the MCM-D interconnect levels. Furthermore, monolithic integration will allow higher operating frequencies. For example, the bump used for a flip-chip interconnect introduces an inductance that cannot be ignored at very high frequencies. A process flow in accordance with the present invention produces variable impedance RF-MEMS components, such as switches and varicaps combined with interconnects which allow connection to other devices. MEMS devices are known generally from "The MEMS Handbook", M. Gad-el-Hak, CRC Press, 2001. Moreover, these RF-MEMS components can be integrated with a multitude of fixed value RF components, such as inductors, capacitors and resistors, to yield complete passive RF systems on a chip (SoC). Further, hybrid integration through flip-chip assembly of ASICs is possible resulting in active RF systems on a package (SoP). It allows the flip-chip hybrid integration of RF-IC's to produce a single package solution of a complete RF system, e.g. a transceiver for mobile communications.

In one aspect of the present invention high quality fixed and tunable passive devices combined with interconnects are provided within a single process flow resulting in a substrate that can serve as platform for the assembly of the active circuitry.

The variable passive components which can be integrated on a substrate in accordance with the present invention include without limitation: digitally encoded variable capacitors (consisting of fixed value capacitors and MEMS, that is, variable capacitors), switches with optional on-chip biasing networks, adaptive matching networks, entire (true time delay) switched line phase shifting networks (composed of RF-MEMS switches, CPW lines and biasing components on a single die), switching matrices (composed of RF-MEMS switches, interconnected through multilevel CPW lines), switched filter banks (composed of RF-MEMS switches, fixed frequency filters either MCM-D LC type or mechanical filters, CPWs and biasing components).

The present invention is based on modifying the processing steps and materials of conventional MCM processing to include steps such as sacrificial layer etching to manufacture tunable, "movable" or more generally "mechanically variable" devices as well as interconnects. Typical moveable elements are beams, especially cantilever beams, membranes and bridges and all other elements which can be made by deposition of layers followed by patterning. Local hermetic sealing as required for switches, filters and tunable capacitors can also be provided.

In accordance with the present invention the MEMS fixed or variable IPD's are formed together with the MCM-D fixed IPD's and the interconnect layers in the thin film layers of the MCM-D stack. The MCM-D flow is adapted to allow the optimized integration of these MEMS IPD's. This change in process flow accounts for the use of materials required for optimization of the MEMS IPD otherwise the processing of the MEMS IPD might be restricted by the material properties of the MCM-D platform. A mutual influence on processing conditions is then present. This approach may be also labeled as dedicated, flexible or modular integration of MEMS IPD in the MCM-D stack. In this approach a selection of materials is made to provide acceptable variable IPD. Additional dedicated materials having the desired properties can be introduced in such a way that these dedicated materials do not deteriorate the MCM-D materials and in turn that the properties and characteristics of these newly introduced materials are not influenced by further processing of the MCM-D stack.

Preferably, the MEMS fixed or variable IPD's are formed together with the MCM-D fixed IPD's in the thin film layers of the MCM-D stack in a single process sequence. The MCM-D process flow is fully exploited to manufacture the MEMS IPD's, however the flow is not changed. In order to simultaneously form the MEMS and MCM-D IPD only changes in the layout, i.e. lithographic mask info, are necessary to selectively or locally form or remove the desired layers.

Figure 4:
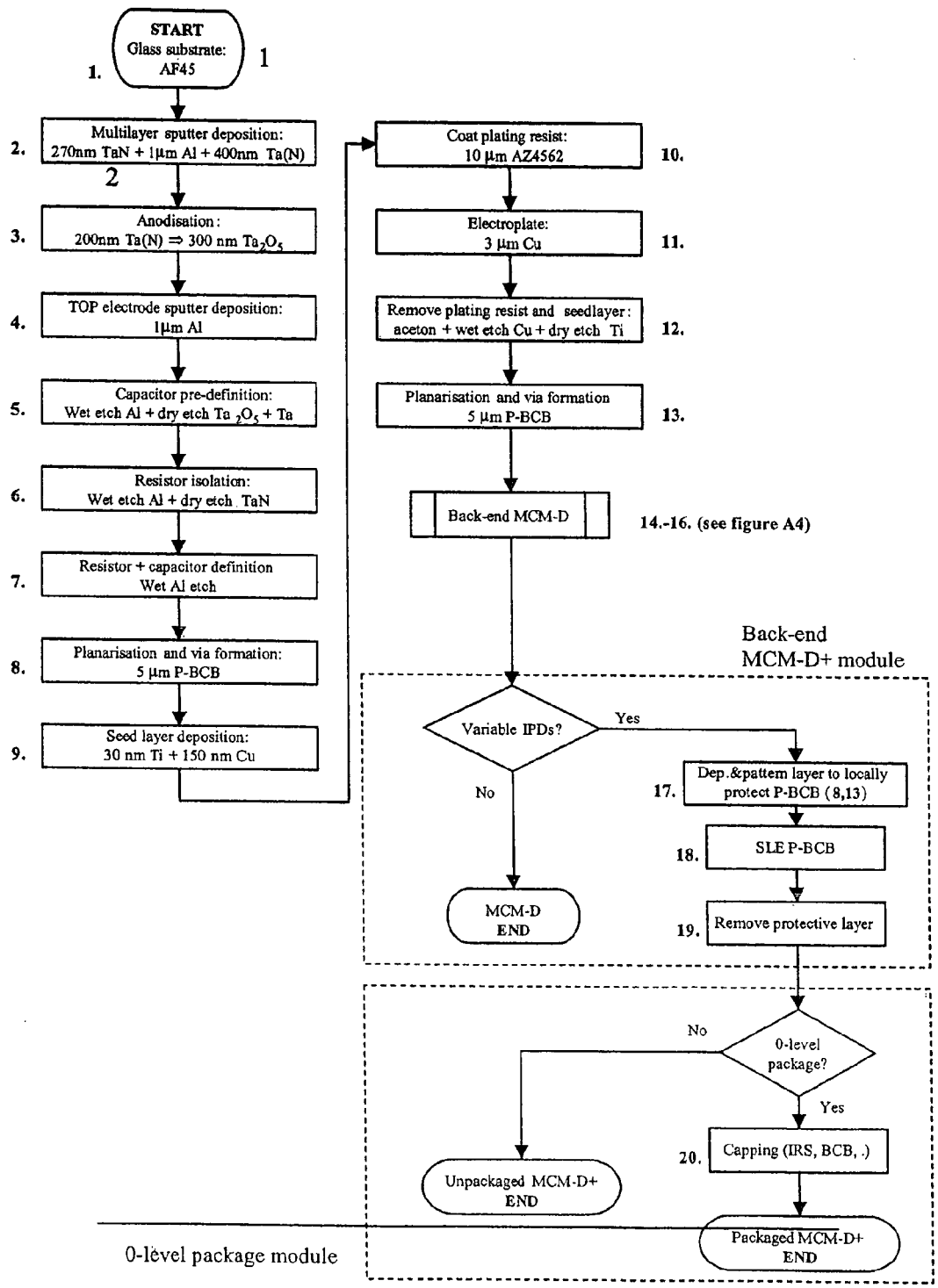

A preferred embodiment is illustrated in FIG. 3 represented as cross sections of devices produced in accordance with a process flow shown in FIG. 4 outlining the basic process flow of the MCM-D+ technology based on the full integration of RF-MEMS into the existing MCM-D. The RF-MEMS based variable IPDs are fully embedded in and simultaneously processed with the MCM-D fixed IPD and interconnects or wiring, thereby making use of already present material layers such as $Ta_2O_5$, BCB, Ti/Cu/Ti, etc. As the multilayer thin film MCMD technology is the starting point this implies in this preferred embodiment only limited flexibility with respect to the choice of materials for the variable IPDs is required to achieve a good performance. For instance, limited freedom is given for varying the thickness of certain layers. An advantage of the fully integrated process flow is a minimum number of masks and thus minimal cost.

The sequence chart given in FIG. 3 shows a preferred embodiment in which MCM-D and MEMS devices are manufactured in a single process flow. In the figure the left hand side of each cross-section shows the construction of typical MCM-D elements, e.g. a metal interconnect, insulating layers, resistors, inductors and capacitors, whereas the right hand side shows the development of a typical MEMS device with a movable element, e.g. a switch or switch banks.

In step 1 a substrate 1 is provided. This can be a suitable MCM-D substrate such as quartz, or could be a semiconductor substrate such as monocrystalline silicon. It is preferred in some devices if the substrate 1 is an insulating substrate. A non-semiconductor substrate may be used which may be preferred because of its lower cost. In step 2, a first metal layer 2, 3, 4 is formed, e.g. by sputtering or other suitable deposition technique. An example would be a multilayer sputtering process to deposit a TaN (tantalum nitride) layer 2 of 270 nm thickness, an aluminum layer 3 of 1 micron and a second tantalum nitride layer 4. In step 3 a first dielectric layer 5 is formed, e.g. 300 nm tantalum oxide formed by anodizing the top layer 4 of tantalum nitride. The advantage of using tantalum oxide is that it has a high dielectric constant and therefore large capacitors can be made smaller and more compact. An alternative is to use a nitride insulating layer. In step 4 a second metal layer 6 is formed, e.g. by sputtering 1 micron of aluminum. Step 5 is the first step in which the processing is altered so that specific and dedicated structures are formed for the MEMS and the MCM devices. On the MCM side a capacitor will be formed and the first metal layer 3 exposed for the formation of resistors. On the MEMS side a switch will start to be formed. Firstly, a photoresist layer is deposited and patterned photolithographically using a first mask to define the capacitor stack on the MCM side and the contact area of the switch on the MEMS side. The second metal layer 6 is etched, e.g., by a wet etch, the first dielectric layer 5 is then a dry etched using the patterned second metal 6 as hard mask etch to form capacitor dielectric layer 36. the non-anodized part of the second tantalum nitride layer 4 is dry etched selfaligned to the upper layers. In step 6 a second photoresist is deposited and patterned photolithographically using a second mask to define and outline resistors on the MCM side and to continue forming the switch on the MEMS side, e.g. the aluminum layer 3 is wet etched and the tantalum nitride layer 2 is then dry etched using layer 3 as hard mask. In this step 6 also the bottom electrode (37) of the capacitor is also defined. In step 7 a third photoresist is deposited and patterned photolithographically using a third mask to form an interconnect line 41, complete the resistor 40 and to form a ring on the capacitor, defining then the top electrode 35, on the MCM side whereas on the MEMS side, the second metal layer 6 is removed. To achieve this the aluminum layer 3 on top of the interconnect line 41 is wet etched in the region which forms the resistor 40, the aluminum layer 6 on top of the capacitor is wet etched to form the ring on the capacitor whereas the aluminum layer 6 on the switch is wet etched to expose the dielectric layer.

A top view at this point is shown in the bottom figure of step 7, whereas the top figure shows a cross-section along the line A-A.

Figure 5:
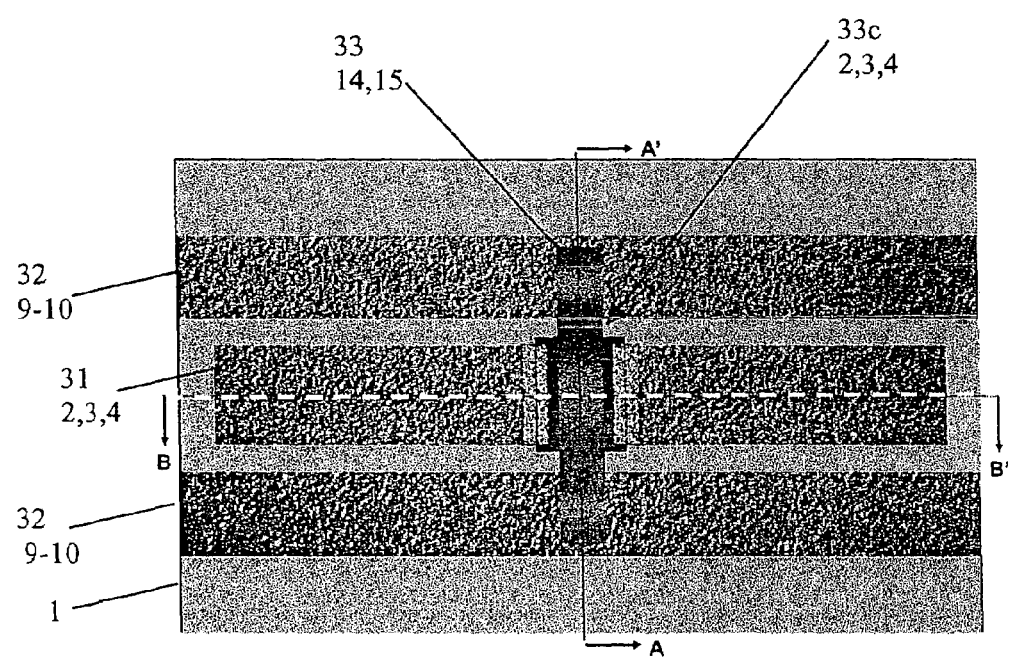
FIG. 5 is a top view of an RF MEMS switch.

The definition of the first metal layers in step 1-7 may result in the formation of fixed passive devices such as resistors, capacitors, interconnections, coplanar wave guides on either the MCM or the MEMS side of the module. In the next step 8 a first level of interlevel dielectric (7) is deposited, e.g. a spun BCB layer of 5 micron thickness is applied. This layer planarizes the surface. This layer is used to provide insulation and can also be used to make capacitors. In step 8 this BCB layer 7 is spin-coated over the substrate. Then a fourth photoresist may be deposited and patterned photolithographically using a fourth mask. If a photosensitive BCB is used this layer 7 may be directly photolithographically patterned (using the fourth mask) without an additional photoresist layer. Openings or via's 8 are defined in this layer to contact the passive elements obtained during the previous processing on the MCM side, e.g. the capacitor top electrode 35, the terminal 41 of the resistor 40. Normally these openings are lying within the perimeter of the passive devices. At this stage in the processing the via (fourth) mask is also adapted to remove the BCB dielectric layer 7 from parts of the MEMS elements, e.g. to define the signal line 31 at the switch location. An aspect of the present invention is that an area is defined in which the first dielectric layer (the BCB layer 7) is locally removed to expose thereby an area defining a window in which MEMS devices or parts thereof will be further developed. The bottom figure in step 8 shows a top view of the device at this stage. The top figure in step 8 is a section along the line B-B. As shown in step 9 a metal layer 9 is deposited, e.g. a 30 nm sputtered titanium layer covered by 150 nm copper layer, used as seed layer for electroplating the metal layer 10. In step 10 a fifth resist 11 is applied as a plating resist and patterned using a fifth mask to mask out the structures that should not be plated with the next metal layer 10. The plating resist may be applied by spinning. The plating resist pattern is the inverse of the next metal interconnect pattern and inductor pattern if inductors are to be included in the design. The MEMS element within the window formed in the BCB layer in step 8, will also be covered during coating of the plating resist layer 11. The MEMS device will be protected from the subsequent metal 10 (e.g. copper) plating although the initial window or opening formed in the first BCB layer in step 9 may be partially filled with metal 10 during this subsequent metal plating step in the areas of the initial opening not covered by the plating resist in step 10. After the removal of the plating resist the MEMS element will be still exposed in the window and uncovered by the BCB layer 7 and by the subsequent metal layer 10. Accordingly, in step 11 a metal layer 10 is electroplated onto the complete device, e.g. 3 microns of copper, in the areas not covered by the plating resist 11. This metal layer 10 can form an inductor 43, a second level interconnect line 42 (the first level is item 41) a the ground line of the CPW interconnect: the ground line 32 parallel with the signal line 31 of the CPW These items are exposed and freed by removing the plating resist 11 in step 12, e.g. using acetone. By removing the plating resist from the area comprising the MEMS element under construction a cavity 34 is created in which this MEMS element is located. Also portions of the metal layer 9 applied in step 9 may be etched using a wet etch for the copper layer-part and a dry etch for the titanium layer-part, to remove the metal 9 where it is in contact with the MEMS device under construction. The metal 9 is thus at least removed within the cavity 34. The thickness of the copper layer 10 is much larger than the thickness of the copper layer-part of metal layer 9 applied in step 9 and therefore an insignificant amount of layer 10 is etched in this process. The result of this processing step 12 is that a part of the MEMS element can be a metal layer 10 at the borders of the cavity 34. In the MEMS device as depicted, this bottom conductive part of the MEMS switch element (33C) is part of the signal line 31. The CPW line 32 can be seen in the top view of the device shown in FIG. 5 and this CPW line extends from one end of the window to the other end, while along the line A-A' in this figure the sides of the CPW line 32 are situated within the perimeter of the window.

In step 13 a second dielectric layer 12 is applied, e.g. by spin-coating with a second BCB layer. The opening 34 in the BCB layer 7 containing the MEMS element and the openings in between the copper plated lines are filled (e.g. between 42 and 43 in step 13). This second BCB layer 12 will planarize the surface, insulate the various interconnect levels and also act as a sacrificial layer on the MEMS side. It can also be used to form the dielectric of a capacitor. The layer 12 is photolithographically patterned using a sixth mask. The exposed areas will form a bonding position (17) to the second interconnect layer (42) and to a part (33b) of a metal bridge (33) of the MEMS device (the bridge is a moveable element). The layer 12 will be removed aligned to and overlapping the cavity 34, so that the metal line 32 at the border of the cavity 34 is exposed. In step 14 a seed layer 13 is applied, e.g. sputtering of 30 nm titanium and 150 nm copper. The last metal layer is formed during steps 14-17, which can be labeled as the back-end processing part of the MCM-D flow, but as was done in step 10 the MCM-D mask defining the pattern of the plating resist 16 is adapted. In step 15 a plating resist layer 16 is applied and patterned with a seventh mask. In this step the plating resist is removed in an area substantially on top of and overlapping the MEMS element and a thick metal layer 14, 15 is formed overlapping the MEMS element, e.g. by electroplating a 2 micron copper layer and a solder stack comprising a nickel/gold/lead/tin layer. In step 16 the plating resist is removed with a solvent such as acetone and portions of the copper-seed metal layer 13 applied in step 14 are removed by wet etching and coplanar portions of the titanium layer-part of metal 13 applied in step 14 are removed by dry etching. To release the variable passive device, comprising at least one displaceable or movable element or part, the $2^{nd}$ dielectric layer 12 deposited in step 13, is removed locally in step 17 to form a cavity 34. This BCB layer 12 acts a sacrificial layer in conventional MEMS processing. By locally removing the BCB layer freestanding elements are created of the MEMS device such as a bridge. To prevent that BCB is removed everywhere a protective layer is deposited and patterned using an eighth mask. After the Selective Layer Etch (SLE) of step 17 this protective is selectively removed without affecting the materials already present on the MCM-D+ platform. If in the additional step 17 the second BCB layer 12 is removed, e.g. by selective layer etching (SLE), the patterned thick metal layer 14-15, overlapping at least along one direction the underlying MEMS element, will be released. A freestanding metal structure 33 being the movable/variable part of the MEMS element is obtained. The thus manufactured device can be sealed from the outside world by means of an integrated zero-level (0-level) packaging technique.

The MEMS switch manufactured by the above method may be a shunt switch implemented on a co-planar waveguide (CPW) and in essence behaves as a capacitive switch. It displays two states, one characterized by a high capacitance and another by a low capacitance. The switch consists of a suspended movable metal bridge or membrane 33, which is mechanically anchored and electrically connected to the ground of the CPW. When the bridge is up, the capacitance of the signal line to ground is low and the switch is in the RF-ON-state, i.e., the RF-signal freely passes from one side of the CPW to the other side. Upon activation, the bridge pulls down onto a dielectric layer placed locally on top of the signal line 31. The switch thus changes its state, the capacitance becomes high and the switch is in the RF-OFF-state, i.e. the RF-signal is now "shorted" to ground. The DC actuation signal line 31. The switch thus changes its state, the capacitance becomes high and the switch is in the RF-OFF-state, i.e. the RF-signal is now "shorted" to ground. The DC actuation voltage at which the switch changes state is called the "pull-in voltage". The pull-in voltage for the series switch shown in FIG. 3 can be close to 30V. In operation, the DC control voltage and the RF signal are superimposed and applied to the signal line 31. Other devices which can be made by adapting the above manufacturing method include:

switches (SPST, SPDT, SPMT);
variable/tunable capacitors;
mechanical (MEMS) resonators;
and a multitude of combinations of passives or (simple) tunable/switchable modules:
tunable LC tanks;
tunable LC filters;
tunable/switchable transmission line resonators;
tunable/switchable transmission line filters;
mechanical (MEMS) filters;
LC matching networks;
MEMS-based true time delay phase shifters;
switch (LC, stripline and mechanical) filter banks;
tunable "inductors" (by varying the capacitive load on the inductors); and
LC tunable filters and a single pole double throw (SPDT) switch, with integrated buried RF feedthroughs, as schematically shown in FIG. 2. With 0-level packaging is understood the formation of a sealed cavity on the substrate, i.e. MEMS substrate, MCM-substrate, itself. The solder ring (18) can either be processed on the capping wafer (20) or on the top surface of the MCM-D+ device wafer (1). With 1-level packaging is understood the packaging or mounting of the chip or device in a package or housing followed by the sealing of the package or housing. The package can then be mounted e.g. the MCM-substrate or other suitable technology platform. Contrary to this FIG. 2 illustrates a 0-level package, according to the present invention. A series switch (33) is formed as a variable passive device on an MCM-D substrate (1) or device wafer in accordance with the above-described process. This MCM-D substrate and/or the surface or top layer of the MCM-D another side of the cavity, e.g. the top side of the cavity. Both sides, top and bottom in FIG. 2, of the cavity are connected by e.g. a solder ring (18), shown by the columnar cross section of the solder sealing ring in FIG. 2, to hermetically seal the cavity. The switch is encapsulated in a cavity formed by the MCM-D substrate (1) and/or the MCM-D stack, a capping element (20) and a sealing element (18) connecting the substrate and/or MCM-D stack and the cap layer. This sealing element is in contact with the capping element (20) and the surface of the substrate or MCM-D stack along its entire perimeter. The sealing element (18) bonds the capping element (20) to the MCM-D substrate (1) and/or stack. The sealing element can be solder material, e.g. Pb/Sn, as disclosed in EP0951069 "Method of fabrication of a microstructure having an inside cavity" by H. Tilmans, et al. The sealing element can be a resin, preferably BCB. The BCB can be dispensed or deposited and subsequently patterned along the perimeter of the cavity to create a ring of BCB. The capping element can be attached and fixed to this ring of BCB, forming the sidewalls of the cavity. The capping element (20) can be placed on top of the MCM-D stack, in direct contact with the BCB dielectric layer or a ring of BCB localized in a continuous geometrical pattern or curve on the top surface of the MCM-D substrate. The capping element (20) can be a membrane over the cavity formed in the MCM-D stack. As shown in FIG. 2 the electrical contact between the device within the cavity, e.g. an electrical switch (33), and the outside world can be made in a metal layer (41) embedded in the MCM-D dielectric stack. This metal layer can be the aluminum layer patterned in step 7 or 11 of FIG. 3. The conductive connection or feedthrough between the encapsulated device (33) and the other devices on the same technology platform (1) doesn't affect the sealing of the cavity as no electrical contact is made between the solder sealing ring (18) and the metal wiring (e.g. 41) thanks to the dielectric material (12) surrounding this conductive pattern. The surface of the MCM-D stack on which the solder ring is formed is planerized by the BCB layers (7, 12) used in the build-up of the MCM-D stack and offers a substantially flat surface on which the connecting material of the connecting element can be deposited along a curve. As shown in FIG. 2 the connecting metal is used as the signal line of a coplanar wave guide (CPW) to transport an RF signal from a chip to the cavity and vice-versa.

Figure 6:
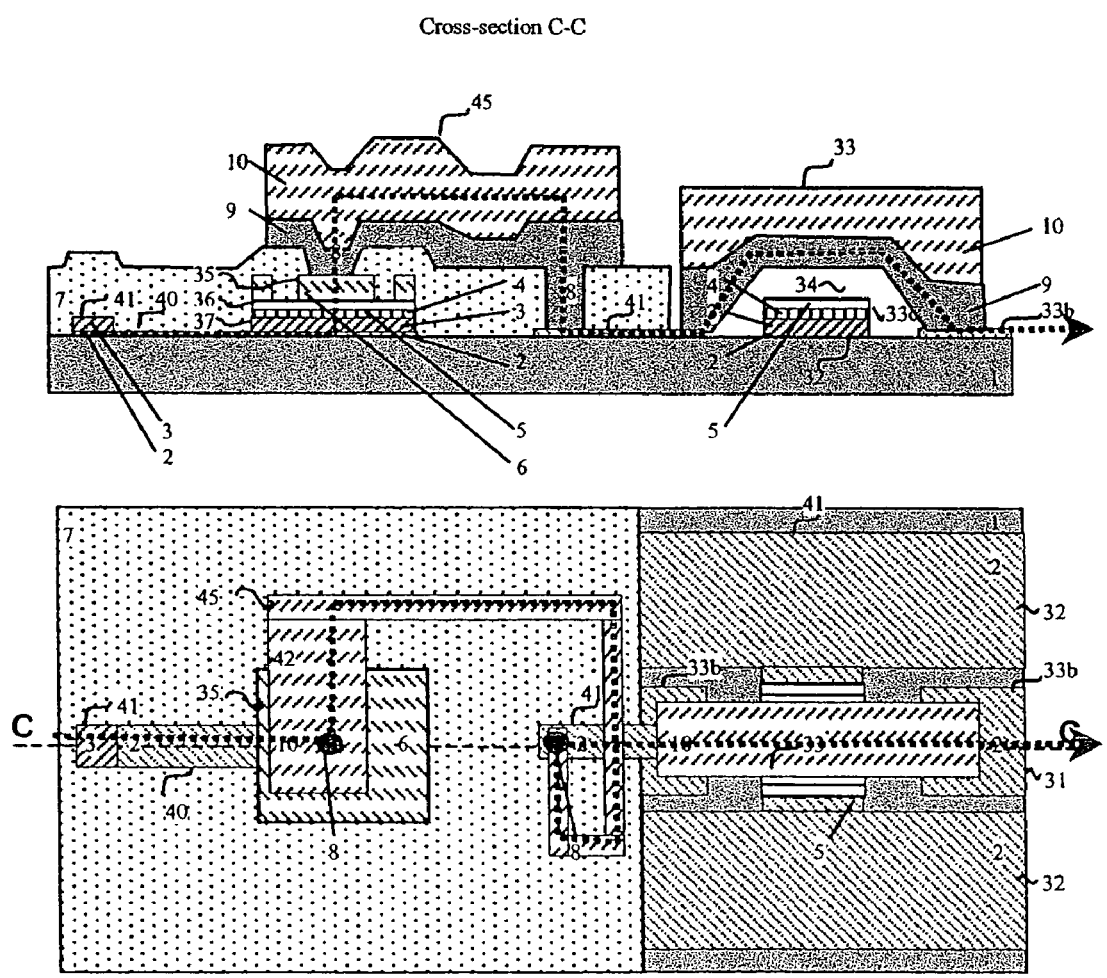
FIGS. 6a and 6b are a cross section showing an embodiment of the invention, only using two levels of interconnect.

In the above embodiments two interdielectric layers (7,12) and three metal layers (2,3,4,6-9,10-13,14,15) have been described to form the interconnect portion of a device in accordance with the present invention which is located adjacent laterally to a MEMS device including at least one moveable element. However, the present invention is not limited to this number of layers. A device in accordance with an embodiment of the present invention is shown in FIG. 6 in which only two interconnect layers and one interlevel dielectric layer are used to form the interconnect section. At the first interconnect level the following may be provided: an optional resistor 40 (using layer 2, the resistor is not an essential element in the MCM-D microwave circuit), a capacitor 35, 36, 37 with a bottom electrode 37 (using layers 3-2), dielectric 36 (using layers 5) and a top electrode 35 (using layer 6), a first interconnect layer 41 (using layers 2-3). Via's 8 etched into the BCB dielectric layer 7 to connect the capacitor top and bottom electrodes (35, 37) and/or the resistor (40) and/or a coil inductor 45. A CPW line 32 is formed in the second metal interconnect layer 9, 10 (level 42) and the coil 45 which feeds the signal from the capacitor 35, 36, 37 to the bridge (33) is also formed in metal layers 9,10. In the variable passive device section on the right part, the bottom part of the switch 33c is formed from the same layers as the capacitor although the top electrode 35 is here optional and depends on the type of switch. Only the bottom electrode 37 and the dielectric 36 are usually used. The bridge metal 33 is formed from the 2nd metal interconnect level (using layers 9-10). The bridge feet 33b corresponds to the via 8 formed through the BCB dielectric layer 7, opened at the same time as the MCM-D interconnect vias used to contact the capacitor. When forming openings to contact the top electrode (35) of the capacitor openings are etched in the BCB layer ($1^{st}$ dielectric, 7) to expose the bridge feet 33b. During the formation of the $2^{nd}$ interconnect level the metal layers (9,10) fill not only the vias 8 but also the openings to the bridge feet 33b. These openings thus allow anchorage of the bridge to the substrate or first (lower) interconnect level. Similar to the method in the previous embodiments, the cavity 34 is formed by sacrificial etching the BCB dielectric layer 7 after processing of the second metal interconnect layers 9-10. The bridge 33 is anchored to the bridge feet 33b and hence the underlying dielectric BCB sacrificial layer 7 is removed locally to release the bridge 33.

The process flow shown in FIG. 3 has to be modified to achieve this structure. Firstly, the patterning in steps 5 and 6 must be modified to provide the interconnect 41 between the lower end of the inductor via 8 and the bridge feet 33b. In step 8 the BCB layer 7 patterning step is modified to provide the via 8 from the inductor down to the first metal layers (2, 3, 4). The metal layer 9, 10 applied in the previous embodiments in steps 9 to 12 is used to form the bridge 33 as well as bonding pads 44. To achieve this the plating resist 11 of steps 10 to 12 is patterned accordingly. The CPW line 32 is formed from the first metal interconnect layer 2, 3, 4 but now runs parallel to the bridge rather than perpendicular to it. The main difference between the device of FIG. 6 and that formed in accordance with the process of FIG. 3 is that the bridge 33 is made in the second metal interconnect layer 42 and the interconnect between the inductor 45 of the MCM-D section and the bridge 33 of the MEMS section is made in the first metal layers 41, i.e. in the metal layer first applied to the substrate, whereas in the scheme of FIG. 3 the bridge is made using the third interconnect metal layer and interconnect between the bridge and the inductor is made using the second interconnect metal layer 42. Also, in this embodiment, the two electrodes of the CPW ground line 32 are joined to the lower electrode 33C of the capacitor of the switch whereas in the previous embodiment the CPW line was joined to the bridge feet.

From the above certain of aspects of the present invention can be appreciated: a metal interconnect is formed with at least two layers of metal and one insulating layer therebetween. Additional metal and insulating layers can be added to this basic structure to form a stack of interconnect layers insulated from each other by dielectric layers. At least one of the metal layers is used to form a part of a moveable component of a MEMS device which is thus integrated into the production flow for the interconnect. The MEMS device is located laterally adjacent to an interconnect portion of the device. The substrate on which these devices are formed need not be a semiconductor substrate—it can be a simpler substrate such as glass or quartz.

In the FIGS. 7 to 11 various embodiments of the present invention are shown all of which can be manufactured by processing steps as described above. In these figures the reference numerals relate to the same components as described for the previous embodiments. The devices shown in FIGS. 7 to 11 are merely examples of the type of devices which can be formed in accordance with the present invention.

FIG. 7 shows a device in which there are two metallization layers and a dielectric layer 7 in between formed on a substrate 1. At the bottom of the figures the equivalent electrical circuit is shown. A moveable element 33, e.g. a part of a switch is formed as a bridge or cantilever beam using the second metal layer which is also used to form fixed passive devices such as an inductor 45. A resistor 40 is formed from the first metal layer and is contacted through a via 8 which runs from a part 44 of the second metal interconnect through the insulating layer 7. The resistor 40 is connected at its other side to one electrode 37 of a capacitor, 35, 36, and 37. The other electrode 35 of the capacitor is connected to one end of an inductor 45. The other end of the inductor is connected to one foot 33b of the bridge 33 through a via 8 and the first metal layer. The signal path through the resistor, capacitor, inductor includes the bridge 33 which is constructed from the metal of the second interconnect layer. The lower electrode 33c of the switch element is formed in the first metal layer. The dielectric layer of the switch element is the same as that of the capacitor. Connections where necessary are made through vias 8 from bonding pads 44 or similar in the second metallization layer to the first metallization layer or adjacent layers. By this method individual passive components such as the resistor 40 or moveable components such as the switch 33 can be formed in separate areas of the substrate and then connected together electrically using the first and/or the second metallization.

Figure 8:
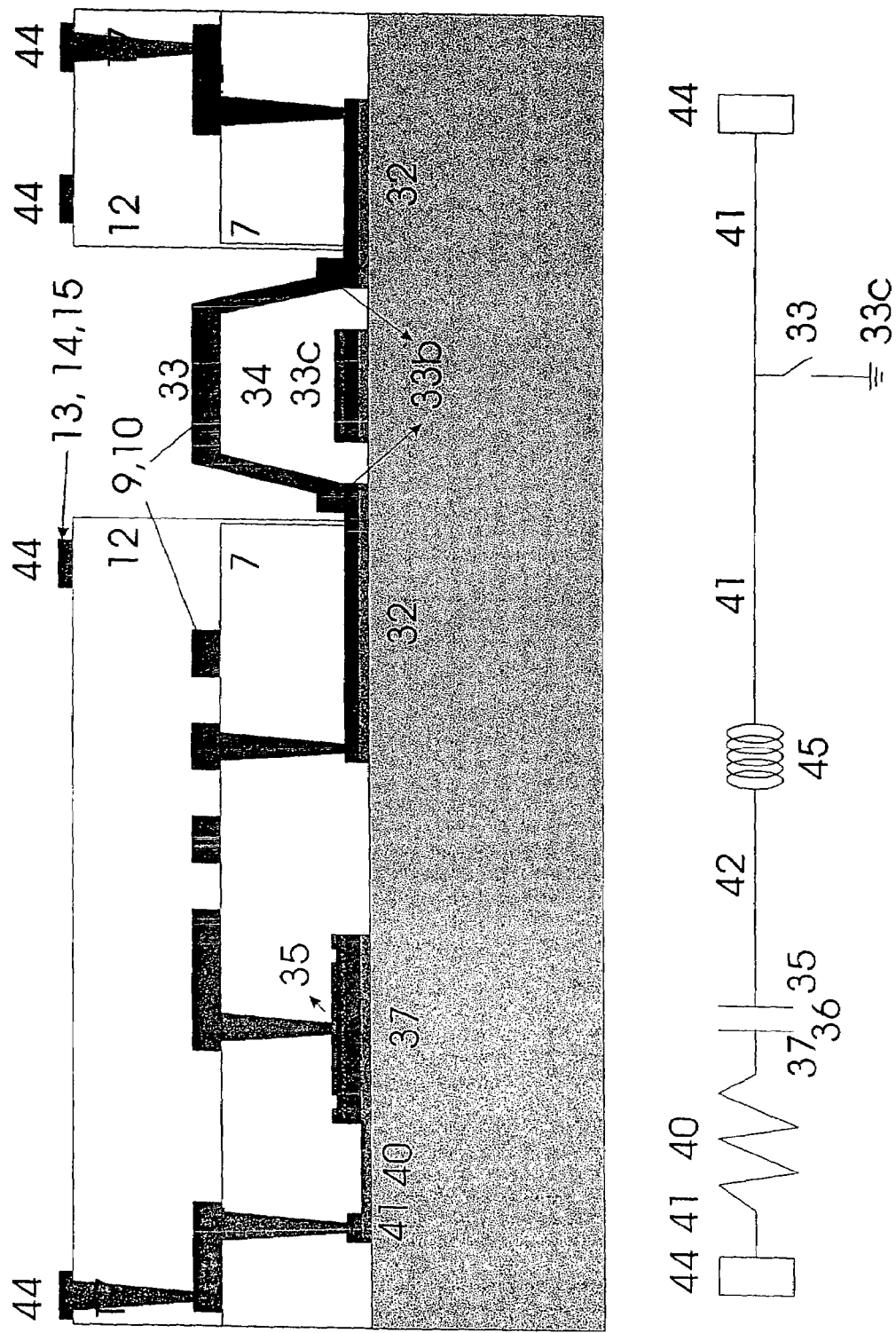

FIG. 8 shows a similar device to that of FIG. 7. The main differences are that there are three layers of metal and two layers of intermediate dielectric 7, 12. The bridge 33 is still made from the second metal layer 10. The third metallization layer (13,14, and 15) is used for bonding pads 44. The third metal layer is in this example is used to form bond pads 44 to link the passive devices to the other chips or to another substrate to which this device can be mounted). The first and second metallization layers are used for connecting the circuit components to each other.

Figure 9:
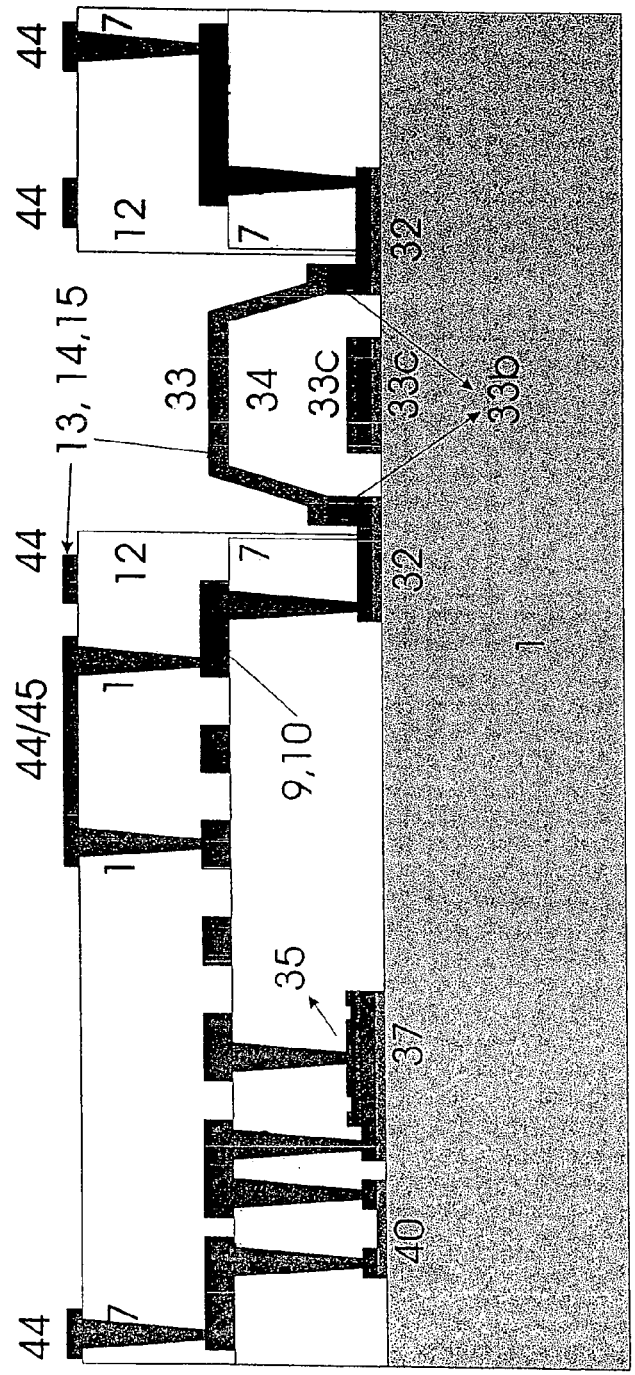
Figure 8:
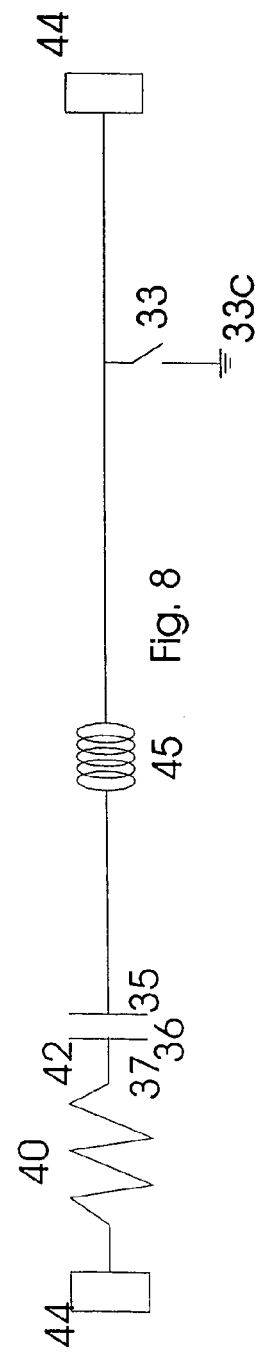

FIG. 9 shows a variant on the type of device shown in, FIG. 8. Here again three metallization layers are provided and two dielectric layers. The bridge 33 is made in the third metallization layer (14,15) as was illustrated in FIG. 3. Connections between the components can be made using the first metal layer (2,3,4) as for instance a connection (32) between the foot of the via 8 from one end of the inductor 45 and the foot 33b of the bridge 33, using the second metal layer, as for instance between the resistor 40 and the inductor 45 or using the third metal layer, as for instance between the inductor 45 and the via 8 leading to the bridge 33.

Figure 11:
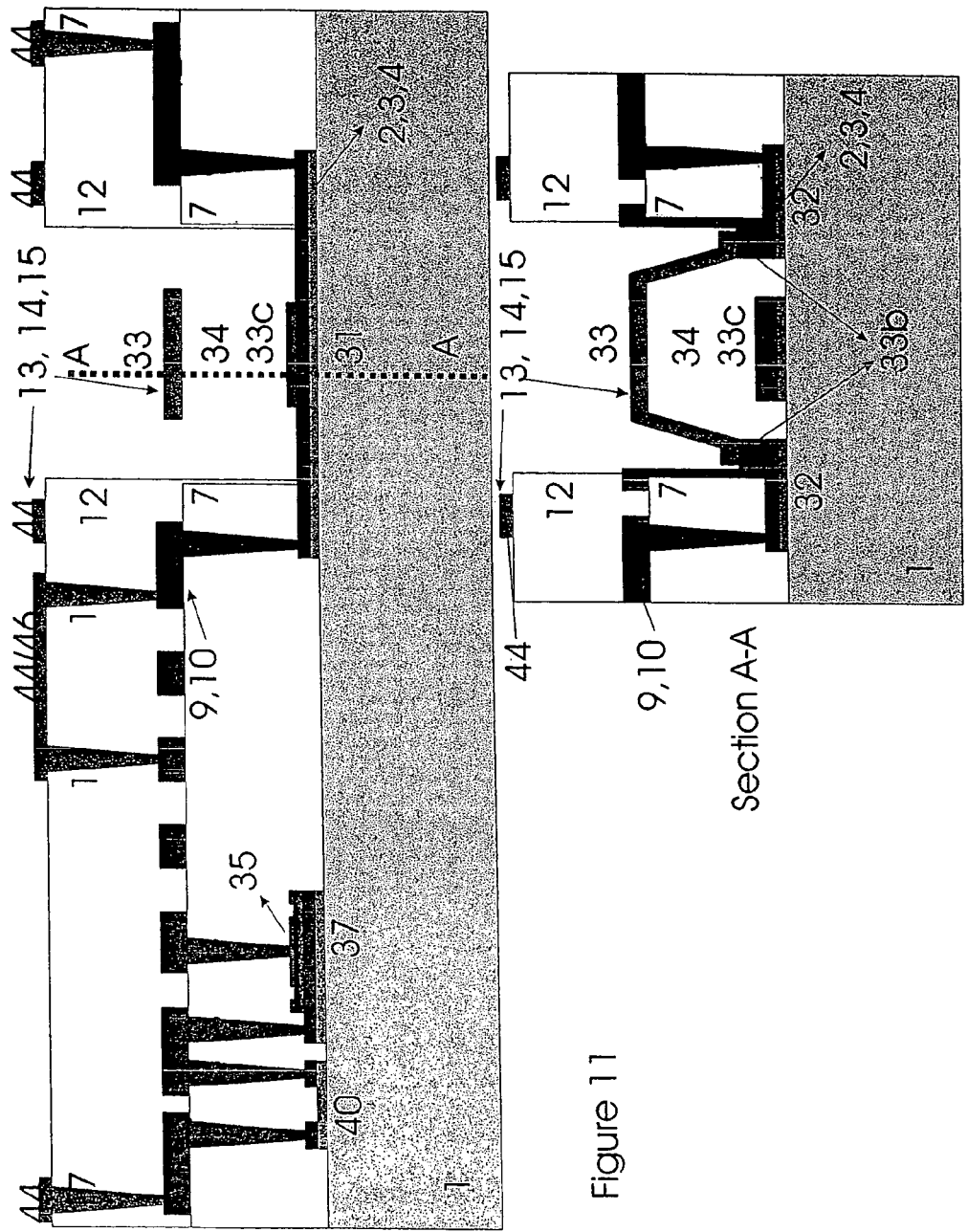

FIG. 11 shows a further variant on the basic design which is considered to be a best mode of carrying out the invention. The left-hand side, which comprises the passive components, is similar to the corresponding part of FIG. 9. However, the signal path through the resistor, capacitor and inductor continues through the signal line 31 of the switch instead of having the RF signal going along the bridge. The moveable element, the bridge, is formed in the third metallization layer at 90° to the bridge of FIG. 9. The lower figure shows a section through the middle of the cavity (34) showing how the bridge feet 33b are connected to the CPW ground lines 32 which are formed from the second metallization layer (9,10). If the bridge (33) is pulled down the signal line (31) is connected to the ground lines and hence the signal path is interrupted. FIG. 10 shows a top view of this device.

Figure 12:
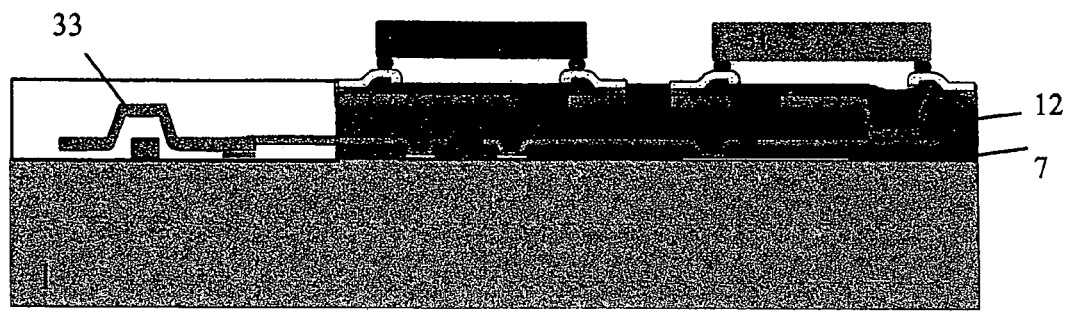
FIGS. 12 and 13 show two alternative methods of attaching a module made in accordance with the present invention to other semiconductor devices.
Figure 13:
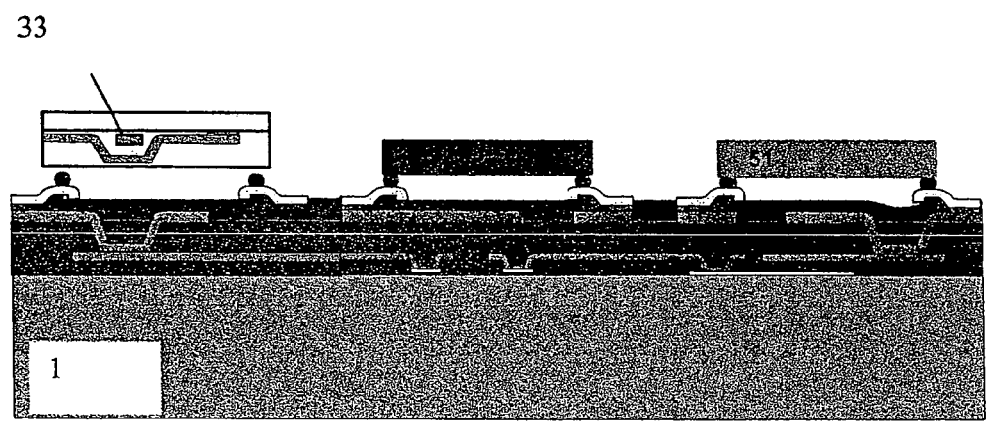

The devices described above may be integrated into other device in any suitable manner. FIGS. 12 and 13 show two possible ways of integration.

In FIG. 12 shows how integrated circuits such as VLSI's may be bonded to an MCM-D substrate in accordance with the present invention. The MCM-D substrate 1 includes a variable device such as a switch 33 as shown on the left hand side of the figure. The MCM-D substrate 1, interconnects and passive devices are constructed as described above with respect to embodiments of the present invention. The bonding pads constructed during this process can be used to attach other devices such as a radio frequency ASIC 50 and a CMOS mixed signal ASIC 51, e.g. by flip-chip bonding. In this embodiment an additional dielectric layer is formed apart from the layers 7,12.

FIG. 13 shows an alternative construction in which a module in accordance with the present invention is connected to another module, e.g. by flip chip bonding. The module in accordance with the present invention is shown on the left with the switch 33 indicated schematically. It has been inverted and the bonding pads 44 created during the process flow described above have been used to flip chip bond the device to another module, e.g. another MCM-D module 1.

While the invention has been shown and described with reference to preferred embodiments, it will be understood by those skilled in the art that various changes or modifications in form and detail may be made without departing from the scope and spirit of this invention.

What is claimed is:

1. A method of making an interconnect module on a substrate, the method comprising:

forming an interconnect section on the substrate, the interconnect section comprising at least first and second metal interconnect layers separated by a dielectric layer, wherein the minimum distance between the substrate and the second layer is greater than the minimum distance between the substrate and the first layer;

forming an RF microelectromechanical (MEMS) device on the substrate at a location laterally adjacent to the interconnect section, wherein the RF MEMS device comprises at least one moveable element comprising at least one of the first and second metal layers, wherein forming the interconnect section comprises forming a plurality of fixed microwave integrated passive devices (IPDs) therein and connecting the fixed microwave IPDs with at least one of the the first and second interconnect metal layers.

2. The method of claim 1, wherein the moveable element is configured to carry a communication signal.

3. The method of claim 1, wherein forming the interconnect section and the RF MEMS device comprise forming on a multi-chip module with deposited thin film (MCM-D) substrate technology.

4. The method according to claim 1, wherein the RF MEMS device is configured to be electrically connected between first and second electrical components, and the moveable element is configured to communicate a data carrying signal between the first and second electrical components.

5. A method of making an interconnect module on a substrate, the method comprising:

forming an interconnect section on the substrate, the interconnect section comprising at least first and second metal interconnect layers separated by a dielectric layer, wherein the minimum distance between the substrate and the second layer is greater than the minimum distance between the substrate and the first layer;

forming a passive device on the substrate at a location laterally adjacent to the interconnect section, wherein the passive device comprises at least one moveable element comprising at least one of the first and second metal layers, wherein the passive device is configured to be electrically connected between first and second electrical components, and the moveable element is configured to communicate a data carrying signal between the first and second electrical components.

* * * * *

UNITED STATES PATENT AND TRADEMARK OFFICE
CERTIFICATE OF CORRECTION

PATENT NO. : 7,368,311 B2  Page 1 of 1
APPLICATION NO. : 10/897271
DATED : May 6, 2008
INVENTOR(S) : Tilmans et al.

It is certified that error appears in the above-identified patent and that said Letters Patent is hereby corrected as shown below:

At Column 16, Line 36, Delete "in," and insert -- in --, therefor.

Signed and Sealed this

Fourteenth Day of October, 2008

JON W. DUDAS
*Director of the United States Patent and Trademark Office*